United States Patent [19]

Ten Haagen

[11] Patent Number: 4,611,167

[45] Date of Patent: Sep. 9, 1986

[54] AUXILIARY WINDING FOR DRIVING ELECTRIC METER ACCESSORIES

[75] Inventor: Christopher W. Ten Haagen, Rochester, N.H.

[73] Assignee: General Electric Company, Somersworth, N.H.

[21] Appl. No.: 711,717

[22] Filed: Mar. 14, 1985

[51] Int. Cl.[4] ............ G01R 31/02; G01R 31/06; G08B 21/00
[52] U.S. Cl. ...................... 324/137; 324/55; 324/126; 340/646
[58] Field of Search ........... 340/646, 641, 637; 324/144, 133, 137, 126, 127, 55; 322/99; 310/68 B

[56] References Cited

U.S. PATENT DOCUMENTS 1,901,701  3/1933  Coffin ..................... 324/55
2,613,260  10/1952  Stevens ................... 340/646

FOREIGN PATENT DOCUMENTS 0623168  5/1949  United Kingdom ........... 340/646

*Primary Examiner*—Reinhard J. Eisenzopf
*Assistant Examiner*—Jose M. Solis
*Attorney, Agent, or Firm*—Robert E. Brunson; Thomas R. Morrison

[57] ABSTRACT

A flux shunt includes a pickup plate parallel to, and closely spaced from, an outer surface of a voltage stator winding of a voltage stator for an electric meter drive apparatus. A flux-return tab of the flux shunt passes through an auxiliary coil and enters a flux-return slot in the voltage stator core of the voltage stator. The flux-return tab is biased into intimate mechanical contact with a surface of the flux-return slot both to prevent buzzing and to provide a low-reluctance return path for flux picked up by the pickup plate. The return flux, passing through the auxiliary coil induces a voltage in windings thereof for powering meter accessories such as, for example, a light-emitting diode whose illunination is indiciative of excitation of the core material of the voltage stator.

8 Claims, 5 Drawing Figures

AUXILIARY WINDING FOR DRIVING ELECTRIC METER ACCESSORIES

BACKGROUND OF THE INVENTION

The present invention relates to electric meters and, more particularly, to apparatus for developing a driving voltage for meter accessories.

Conventional electro-mechanical electric meters employ a conductive metal disk rotated as the rotor of a small induction motor by interaction with opposed voltage and current stators. The rotational torque experienced by the disk is proportional to the voltage applied to the load multiplied by the current consumed by the load; that is, the power consumed by the load. Disk rotation is magnetically resisted in proportion to its rotational speed. Thus, the disk speed is proportional to the power consumed by the load. Each rotation of the disk represents a predetermined increment of energy consumed. The rotations of the disk are accumulated over time in a mechanical or electronic accumulator, or register, for reading by the utility supplying the power for billing purposes.

For some purposes, it is desirable to produce a small amount of auxiliary power within the electric meter for driving accessory devices such as, for example, an indicator which responds to excitation of the core material in a voltage stator. In meters having two or three voltage stators, an independent indicator is desirable for each voltage stator to provide assurance that proper excitation exists.

Voltage stators conventionally employ a core consisting of E-shaped laminations. A voltage stator winding is wound about the center leg of the core. U.S. Pat. No. 3,815,027 discloses a small winding disposed in the auxiliary gap between the center leg and one of the side legs of the core for developing a small voltage. This small voltage may be used, for example, to illuminate a light-emitting diode. This technique tends to unbalance the flux field of the voltage stator by as much as, for example, about seven percent at light loads. Such an imbalance tends to upset the light load adjustment of the meter. Thus, the small winding cannot be installed after manufacture without repeating the light load adjustment. If late addition of such a small winding is contemplated, the adjustment range built into the light load adjustment must be made sufficiently broad not only to accommodate normal manufacturing tolerances, but also to include additional range to overcome the imbalance imposed by the small coil in the auxiliary gap. When the range is thus increased, the resolution of adjustment is conventionally degraded. That is, when a screw-type adjustment is provided, if the full adjustment range consists of two screw turns, if a total adjustment range of ten percent is required, then each turn provides an adjustment of five percent. If an additional range of ten percent must be provided to prepare for a possible late addition of a coil in the auxiliary gap, each screw turn produces a ten-percent change in light load adjustment. Thus each incremental turn of the adjustment screw has twice the effect in the latter case than in the former. Consequently, precise light-load adjustment is more difficult to accomplish.

OBJECTS AND SUMMARY OF THE INVENTION

Accordingly, it is an object of the invention to provide an auxiliary winding for driving electric meter accessories which overcomes the drawbacks of the prior art.

More particularly, it is an object of the invention to provide a flux shunt disposed in a stray flux field external to a winding of a voltage stator which provides a closed return path for the flux to the core of the voltage stator. An auxiliary winding disposed on the flux shunt produces a voltage for driving an accessory.

It is a further object of the invention to provide an auxiliary winding for a voltage stator of an electric meter which is symmetrically disposed with respect to the flux field of the voltage stator.

Briefly stated, the present invention provides a voltage stator for an electric meter drive apparatus in which a flux shunt includes a pickup plate parallel to, and closely spaced from, an outer surface of a voltage stator winding. A flux-return tab of the flux shunt passes through an auxiliary coil and enters a flux-return slot in the voltage stator core of the voltage stator. The flux-return tab is biased into intimate mechanical contact with a surface of the flux-return slot both to prevent buzzing and to provide a low-reluctance return path for flux picked up by the pickup plate. The return flux, passing through the auxiliary coil, induces a voltage in windings thereof for powering meter accessories such as, for example, a light-emitting diode whose illumination is indicative of excitation of the core material of the voltage stator.

According to an embodiment of the invention, there is provided a voltage stator for an electric meter drive apparatus, the voltage stator being of a type having a voltage stator winding on a voltage stator core, comprising a flux shunt having a pickup plate adjacent a peripheral surface of the voltage stator winding, a flux-return tab on the flux shunt, means for providing a low-reluctance flux return path from the flux-return tab to the voltage stator core and an auxiliary coil on the flux-return tab, whereby return flux in the flux-return tab induces a voltage in the auxiliary coil.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
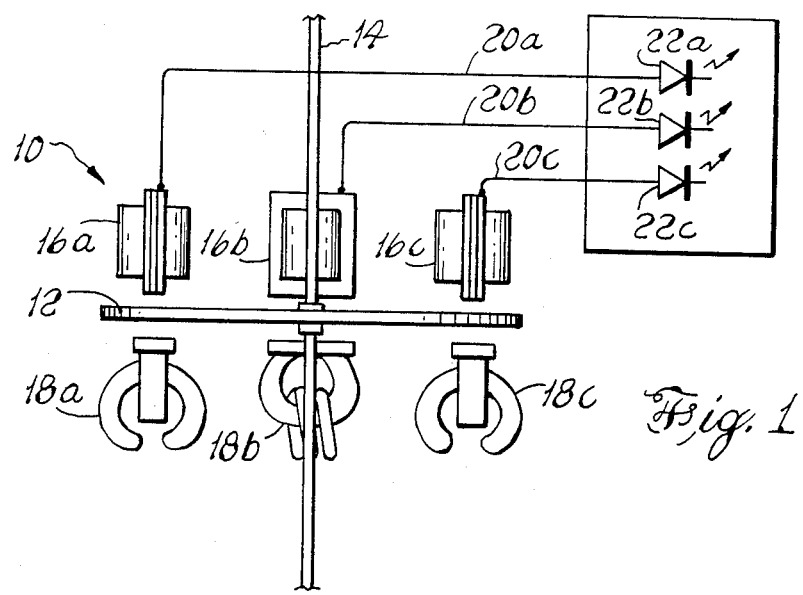
FIG. 1 is a simplified side view of a rotor and driving coils of a three-phase electric meter showing light-emitting diodes energized by power induced from the voltage stators.

Referring to FIG. 1, there is shown, generally at 10, an electric meter drive apparatus. A metallic disk 12, conventionally of laminated aluminum, is rotatably disposed on a shaft 14 which is rotatably supported on conventional bearings (not shown).

From one to three voltage stators 16 may be disposed on one side of metallic disk 12 with a corresponding number of current stators 18 opposed thereto on the opposite side of metallic disk 12. In the embodiment shown, three voltage stators 16 a, b and c are disposed opposed to three current stators 18 a, b and c. Voltages from phases A, B and C of a three-phase supply (not shown) are connected across windings in correspondingly lettered voltage stators 16 and currents in these phases pass in series through correspondingly lettered current stators 18. The total torque applied to metallic disk 12 is proportional to the total power delivered to the load by the three-phase supply.

As will be discussed in greater detail below, a small auxiliary coil (not shown in FIG. 1) associated with each of voltage stators 16 a, b and c is disposed in stray flux external thereto. The small auxiliary coils have induced therein small voltages which are applied on lines 20 a, b and c to suitable indicators such as, for example, light-emitting diodes 22 a, b and c, respectively. Since the voltages are induced in the small auxiliary coils by stray flux from the voltage stators 16 a, b and c, the illumination of light-emitting diodes 22 a, b and c provides a positive indication that the core materials of voltage stators 16 a, b and c are excited.

Figure 2:
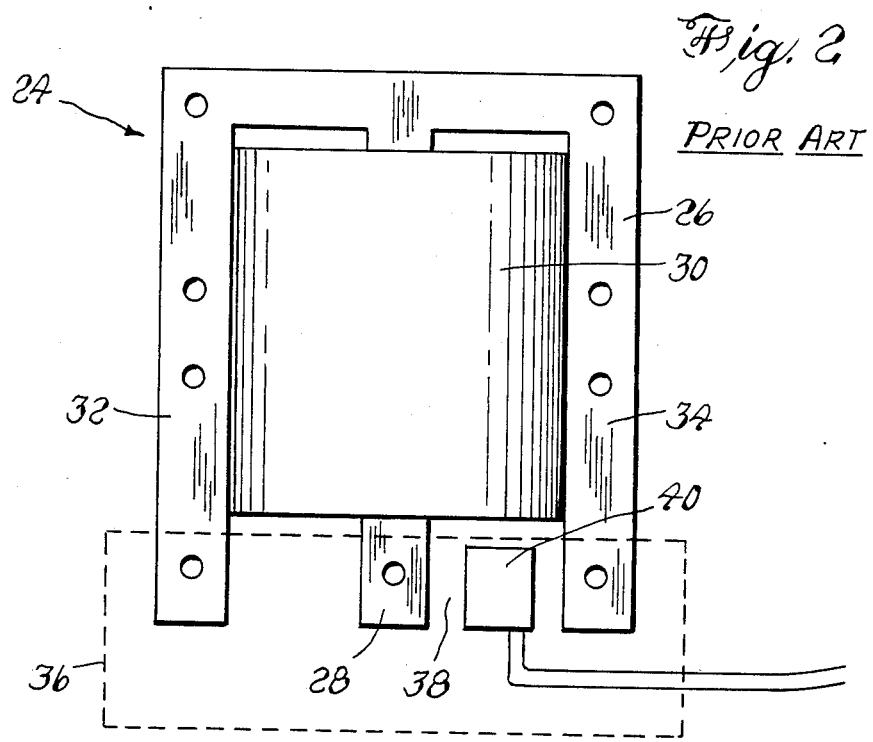
FIG. 2 is a simplified front view of a voltage stator according to the prior art.

Referring now to FIG. 2, there is shown a voltage stator 24 according to the prior art. A voltage stator core 26, preferably consisting of a stack of laminations, includes a center leg 28 upon which a voltage stator winding 30 is disposed. A pair of outside legs 32 and 34 extend parallel to center leg 28 along the outside of voltage stator winding 30. The ends of outside legs 32 and 34 and center leg 28 are joined together mechanically, electrically and magnetically by conventional means not of concern to the present disclosure but whose location is indicated by a dashed box 36. Dashed box 36 may also contain conventional light-load and phase-lag adjustment mechanisms. Since such adjustment mechanisms are conventional and do not form an inventive part of the present disclosure, further description thereof is omitted.

A spacing between center leg 28 and its adjacent outside legs 32 and 34 forms auxiliary gaps 38. An auxiliary coil 40, disposed in one of auxiliary gaps 38, has induced in the windings thereof a voltage sufficient to energize one of light-emitting diodes 22 a, b or c (FIG. 1).

Since auxiliary coil 40 is asymmetrically placed in the flux field of voltage stator 24, it tends to unbalance the flux field, which is capable of producing larger inherent meter errors, especially at light load. Thus, a broader range must be provided in a light-load adjust mechanism in dashed box 36 to compensate for the possibility of larger inherent errors. As noted above, the need to counter the flux imbalance requires a greater adjustment range and results in degradation in adjustment resolution. In addition, if a voltage stator 24 is manufactured and installed in an electric meter drive apparatus 10 without an auxiliary coil 40 in place, and subsequently receives an auxiliary coil 40, then the light-load adjustment must be repeated. Since the light-load adjustment is preferably performed in a factory environment, field addition of an auxiliary coil 40 is not desirable. Should the late-point addition of an auxiliary coil 40 be made in the factory after electric meter drive apparatus 10 is assembled, the requirement to repeat the light load adjustment increases the cost and degrades the timeliness of delivery.

Figure 3:
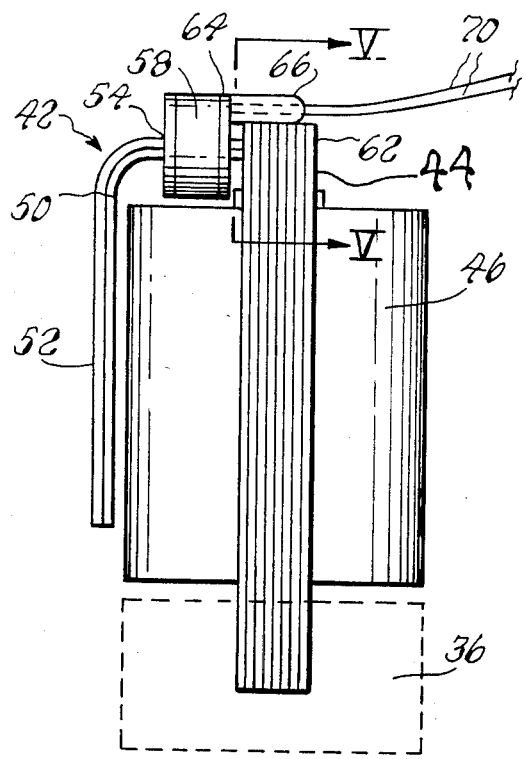
FIG. 3 is a simplified side view of a voltage stator according to an embodiment of the invention.
Figure 5:
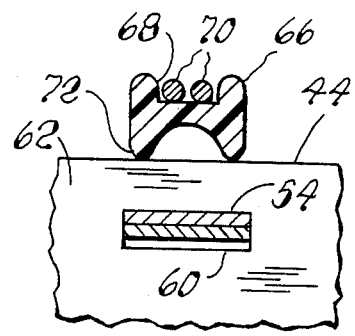
FIG. 5 is a cross section taken along V—V in FIG. 3.
Figure 4:
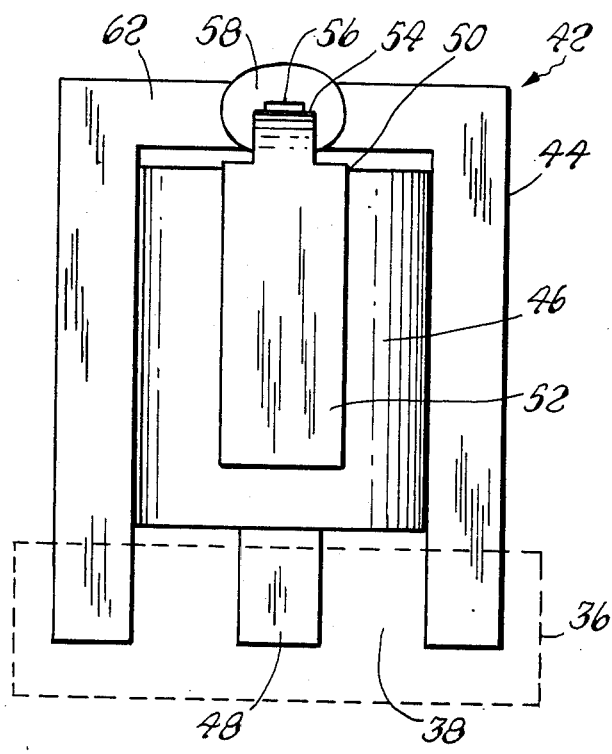
FIG. 4 is a front view of the voltage stator of FIG. 3.

Referring now to FIGS. 3 and 4, there are shown side and front views, respectively, of a voltage stator 42 according to an embodiment of the invention. A voltage stator core 44, made up of a stack of E-shaped laminations, includes a voltage stator winding 46 wound on a center leg 48. As in the above embodiment of the prior art, the locations of light-load and phase-lag adjustments are indicated by a dashed box 36 and are not further detailed. A flux shunt 50 of ferromagnetic material includes a pickup plate 52 disposed parallel to, and closely spaced from, the exterior surface of voltage stator winding 46. A flux-return tab 54 passes through a slot 56 (FIG. 4) in an auxiliary coil 58. Referring now also to FIG. 5, flux-return tab 54 continues beyond auxiliary coil 58 to enter a flux-return slot 60 centrally disposed in a connecting leg 62 of voltage stator core 44.

Auxiliary coil 58 is wound on a spool 64 of a resin material. Spool 64 includes a strain relief and hold-down tab 66 integrally formed therewith. Referring specifically to FIG. 5, strain relief and hold-down tab 66 includes a slot 68 in the upper portion thereof within which coil leads 70 are disposed. A lower portion 72 of strain relief and hold-down tab 66 bears against the upper surface of connecting leg 62. Spool 64 and strain relief and hold-down tab 66 are dimensioned such that flux-return tab 54 is biased upward into intimate mechanical, electrical and magnetic contact with the upper surface of flux-return slot 60. Such intimate mechanical contact prevents the development of buzzing vibration at the line frequency which, in addition to creating an annoying sound, could eventually damage auxiliary coil 58. The electrical and mechanical contact ensures a low-reluctance return path for flux which, in flowing through auxiliary coil 58, induces a voltage therein.

Referring again to FIGS. 3 and 4, pickup plate 52 is retained in position close to, and parallel to, the surface of voltage stator winding 46 by any convenient means such as, for example, by taping it in place. In order to provide additional bias of flux-return tab 54 against flux-return slot 60, the angle through which flux-return tab 54 is bent may be slightly less than that required to permit entry of flux-return tab 54 into flux-return slot 60. Thus, flux-return tab 54 is deflected against the resilience of the material of which flux shunt 50 is made in order to enter flux-return slot 60. Resilient spring-back of flux shunt 50 is effective, after insertion, to bias flux-return tab 54 in the upward direction to further aid the bias provided by strain relief and hold-down tab 66.

Although flux shunt 50 may be made from a single piece of ferromagnetic material, ease in forming the part and the amount of flux developed therein are both aided by manufacturing it of two or more layers of ferromagnetic material. In the preferred embodiment, flux shunt 50 is formed of two layers of ferromagnetic material, each twenty-five thousandths of an inch thick.

The symmetrical positioning of flux shunt 50 with respect to the outside legs substantially reduces the distortion of the flux field from the addition of flux shunt 50 and auxiliary coil 58. In some applications, late point addition of these elements may be possible without requiring compensating adjustment of the light load adjustment. In other applications, although adjustment of the light load adjustment may be necessary, such adjustment is a minor trimming rather than a complete readjustment. The maximum flux field imbalance due to the addition of flux shunt 50 and auxiliary coil 58 that light load adjustment is feasible without expanding the adjustment range conventionally provided.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A voltage stator for an electric meter drive apparatus, said voltage stator being of a type having a voltage stator winding on a voltage stator core, comprising:

a flux shunt having a pickup plate adjacent a peripheral surface of said voltage stator winding;

a flux-return tab on said flux shunt;

means for providing a low-reluctance flux return path from said flux-return tab to said voltage stator core; and an auxiliary coil on said flux-return tab, whereby return flux in said flux-return tab induces a voltage in said auxiliary coil.

2. A voltage stator according to claim 1 wherein said voltage stator core is E-shaped having a center leg and first and second outside legs, said voltage stator winding being disposed on said center leg, said flux shunt further being disposed parallel to said center leg and being disposed symmetrically with respect to said first and second outside legs 3. A voltage stator according to claim 1 wherein said flux shunt includes at least two parallel layers of a ferromagnetic material.

4. A voltage stator according to claim 1 wherein said means for providing a low-reluctance flux path includes a flux-return slot in said voltage stator core, said flux-return tab entering said flux-return slot.

5. A voltage stator according to claim 4 wherein said means for providing a low-reluctance flux path includes means for biasing said flux-return tab against a surface of said flux-return slot.

6. A voltage stator according to claim 5 wherein said means for biasing includes a strain relief and hold-down tab on a spool of said auxiliary coil, a portion of said strain relief and hold-down tab bearing against a surface of said voltage stator core and urging said flux-return tab passing through said auxiliary coil in a direction effective to produce contact between said flux-return tab and said surface of said flux-return slot.

7. A voltage stator according to claim 6 wherein said strain relief and hold-down tab includes a slot therein for guiding coil leads from said auxiliary coil.

8. A voltage stator according to claim 5 wherein said means for biasing includes an unstressed shape of flux shunt requiring deformation to enter said flux-return tab into said flux-return slot, and a resilient spring-back of a material of which said flux shunt is made being effective for producing said biasing.

* * * * *